United States Patent
Shibata et al.

[11] Patent Number: 6,008,539
[45] Date of Patent: *Dec. 28, 1999

[54] ELECTRODES FOR P-TYPE GROUP III NITRIDE COMPOUND SEMICONDUCTORS

[75] Inventors: Naoki Shibata; Junichi Umezaki; Makoto Asai; Toshiya Uemura; Takahiro Kozawa; Tomohiko Mori; Takeshi Ohwaki, all of Aichi-ken, Japan

[73] Assignee: Toyoda Gosei Co., Ltd., Aichi-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/663,696

[22] Filed: Jun. 14, 1996

[30] Foreign Application Priority Data

Jun. 16, 1995 [JP] Japan ..................................... 7-174076
May 31, 1996 [JP] Japan ..................................... 8-160886

[51] Int. Cl.⁶ .................................................... H01L 23/48
[52] U.S. Cl. .............................................. 257/745; 257/81
[58] Field of Search ............................................. 257/745

[56] References Cited

U.S. PATENT DOCUMENTS 5,369,289 11/1994 Tamaki et al. .
5,408,120 4/1995 Manabe et al. .
5,563,422 10/1996 Nakamura et al. ..................... 257/13

FOREIGN PATENT DOCUMENTS 0 622 858 A2  2/1994  European Pat. Off. ........ H01L 33/00
5-291621     11/1993  Japan .
94-25052     11/1994  Rep. of Korea .

OTHER PUBLICATIONS

Foresi et al., "Metal contacts of gallium nitride", Applied Physics Letters 52(22), May 31, 1993, pp. 2859–2861.

*Primary Examiner*—Olik Chaudhuri
*Assistant Examiner*—Douglas A. Wille
*Attorney, Agent, or Firm*—Pillsbury Madison & Sutro LLP

[57] ABSTRACT

An electrode for a Group III nitride compound semiconductor having p-type conduction that has a double layer structure. The first metal electrode layer comprising, for example, nickel (Ni) and the second metal electrode layer comprising, for example, gold (Au). The Ni layer is formed on the Group III nitride compound semiconductor having p-type conduction, and the Au layer is formed on the Ni layer. Heat treatment changes or reverses the distribution of the elements Ni and Au. Namely, Au is distributed deeper into the Group III nitride compound semiconductor than is Ni. As a result, the resistivity of the electrode is lowered and its ohmic characteristics are improved as well as its adhesive strength.

14 Claims, 2 Drawing Sheets

ELECTRODES FOR P-TYPE GROUP III NITRIDE COMPOUND SEMICONDUCTORS

BACKGROUND OF THE INVENTION

1. Field of the Invention

The present invention relates to electrodes for a Group III nitride compound semiconductor having p-type conduction, a Group III nitride compound semiconductor device having this type of electrodes, and methods of forming these electrodes. Especially, the invention relates to electrodes for a Group III nitride compound semiconductor having p-type conduction with improved ohmic characteristics, adhesive strength and contact resistance between the semiconductor and the electrodes.

2. Description of Background Information

Conventionally, gold (Au) that is deposited on a surface of a p-type conductive gallium nitride (GaN) layer is used as an electrode. However, because the adhesive strength between the Au and the GaN layer is poor, an electrode layer made of Au peels easily away from the GaN layer during alloying processes performed on the GaN layer.

Nickel (Ni) is Interposed between the Au electrode layer and the GaN layer so as to improve the adhesive strength, This arrangement, however, leads to poor ohmic characteristic of the semiconductor and high contact resistance between the GaN layer and the Ni.

SUMMARY OF THE INVENTION

An object of the present Invention Is. therefore, to improve the ohmic characteristic as well as the adhesive strength while lowering contact resistance between the Group III nitride compound semiconductor and the electrode. For example, the Group III nitride compound semiconductor can satisfy the formula: $Al_xGa_yIn_{1-x-y}N$, wherein $0 \leq x \leq 1$, $0 \leq y \leq 0$, and $0 \leq x+y \leq 1$.

A first aspect of the present invention is directed to an electrode for a Group III nitride compound semiconductor having p-type conduction. The electrode has at least a double layer structure. Each layer of the electrode includes a metal. The first metal electrode layer contacts the Group III nitride compound semiconductor and the second metal electrode layer is formed on the first metal electrode layer. The first metal electrode layer has an element that has an ionization potential that is lower than that of the second metal electrode layer. The second metal electrode layer has an element that has ohmic characteristics to the Group III nitride compound semiconductor better than that of the first metal electrode layer. The element of the second metal electrode-layer is distributed into the Group III nitride compound semiconductor more deeply than the element of the first metal electrode layer by heat treatment.

Thus, the present invention is obtained by causing a change in the order of distribution of elements by heat treatment. For examples, before heat treatment, the element of the second metal electrode layer exists above the element of the first metal electrode layer. After heat treatment, however, the element of the second metal electrode layer exists below the element of the first metal electrode layer.

According to a second aspect of the present invention, the element of the first metal electrode layer is at least one of nickel (Ni), iron (Fe), copper (Cu), chromium (Cr), tantalum (Ta), vanadium (V), manganese (Mn), aluminum (Al), and silver (Ag) and the element of the second metal electrode layer is at least one of lead (Pd), gold (Au), Iridium (Ir), and platinum (Pt).

According to a third aspect of the present invention, the element of the first metal electrode layer is nickel (Ni) and the element of the second metal electrode layer is gold (Au) Heat treatment reverses the relative positions of these metals, i.e., the gold (Au) moves deeper with respect to the Group III nitride compound semiconductor than does the nickel (Ni).

According to a fourth aspect of the present invention, heat treatment may be carried out at a temperature generally ranging from 400° C. to 700° C.

A fifth aspect of the present invention is directed to a Group III nitride compound semiconductor device that includes an electrode of the type described in the first four aspects of the present invention and semiconductor layers using Group III nitride compound semiconductor that are formed beneath the electrode.

According to a sixth aspect of the present invention, the Group III nitride compound semiconductor device is at least one of a light-emitting diode (LED), a laser diode (LD), and a transistor.

According to a seventh aspect of the present invention, a method of forming an electrode of a Group III nitride compound semiconductor having p-type conduction comprises the steps of:

selecting an element of a first metal electrode layer that has an ionization potential that is lower than that of an element of a second metal electrode layer;

selecting the element of the second metal electrode layer that has ohmic characteristles to the Group III nitride compound semiconductor better than that of the element of the first metal electrode layer;

forming the first metal electrode layer on the Group III nitride compound semiconductor;

forming the second metal electrode layer on the first metal electrode layer; and carrying out heat treatment so that the element of the second metal electrode layer is distributed into the Group III nitride compound semiconductor more deeply than that of the element of the first metal electrode layer.

The resulting metal electrode has a double layer structure comprising a first metal electrode layer and a second metal electrode layer. Because the element of the first metal electrode layer has an ionization potential that is lower than that of the element of the second metal electrode layer, the first metal electrode layer has a greater adhesive strength than the second metal electrode layer. The second metal electrode layer, which has a work function that is larger than that of the first metal electrode layer, or which has a higher ionization potential than that of the first metal electrode layer, has a good ohmic characteristic to the Group III nitride compound semiconductor. Carrying out heat treatment on the electrode Causes the element of the first electrode layer to move to the surface of the second metal electrode layer. In particular, the element of the second metal electrode layer penetrates through the first electrode layer and significantly into the Group III nitride compound semiconductor. A larger portion of the element of the first metal electrode layer moves and distributes on the surface of the electrode. This reversing of the distribution of the elements of the first and the second metal electrode layers improves both adhesive strength and ohmic characteristics between the electrode and the Group III nitride compound semiconductor.

A study of what causes the reversing of the distribution of the elements of the first and the second metal electrode layers was conducted and it was concluded that depositing a metal layer that has a relatively lower ionization potential as the first metal electrode layer, depositing another metal layer having a relatively better ohmic characteristic as the second metal electrode layer, and carrying out heat treatment within a predetermined temperature range tinder low vacuum causes the reversing of the distribution of the elements of the first and the second metal electrode layers. Because the element of the second metal electrode layer penetrates significantly into the Group III nitride compound semiconductor, the ohmic characteristic between the electrode and the Group III nitride compound semiconductor, as a whole, is improved. Further, because the first metal electrode layer includes a metal that has a relatively lower ionization potential, stronger adhesive strength to the Group III nitride compound semiconductor is brought about. As a result of the foregoing, a semiconductor device that has both a strong adhesive and a good ohmic characteristics is obtained.

When, for example, nickel (Ni) is used as the first metal electrode layer and gold (Au) is used as the second metal electrode layer, the gold penetrates through the Ni first metal electrode layer. In sum, the ohmic characteristic is improved by using gold (Au) and the adhesive strength between the electrode to the semiconductor layer is maintained by using nickel (Ni).

A Group III nitride compound semiconductor device having an electrode formed of the double layer structure described above improves the devices characteristics. For example, less voltage needs to be applied and there is less resistivity. In addition, when an electrode formed of the double layer structure described above is used for a LED or a LD, emission efficiency is improved.

The above and other objects, features, advantages, and characteristics of the present invention are further described in the following detailed description with reference to the accompanying drawings by way of non-limiting exemplary embodiments of the present invention, wherein like reference numerals represent similar parts of the present invention throughout the several views.

BRIEF DESCRIPTION OF THE DRAWING

In the accompanying drawings.

PIG. 2B is a sectional schematic illustration of a $p^+$-layer and an electrode after heat treatment.

DETAILED DESCRIPTION OF EXEMPLARY EMBODIMENTS

The present invention will be more fully understood by reference to the following example.

EXAMPLE

Figure 1:
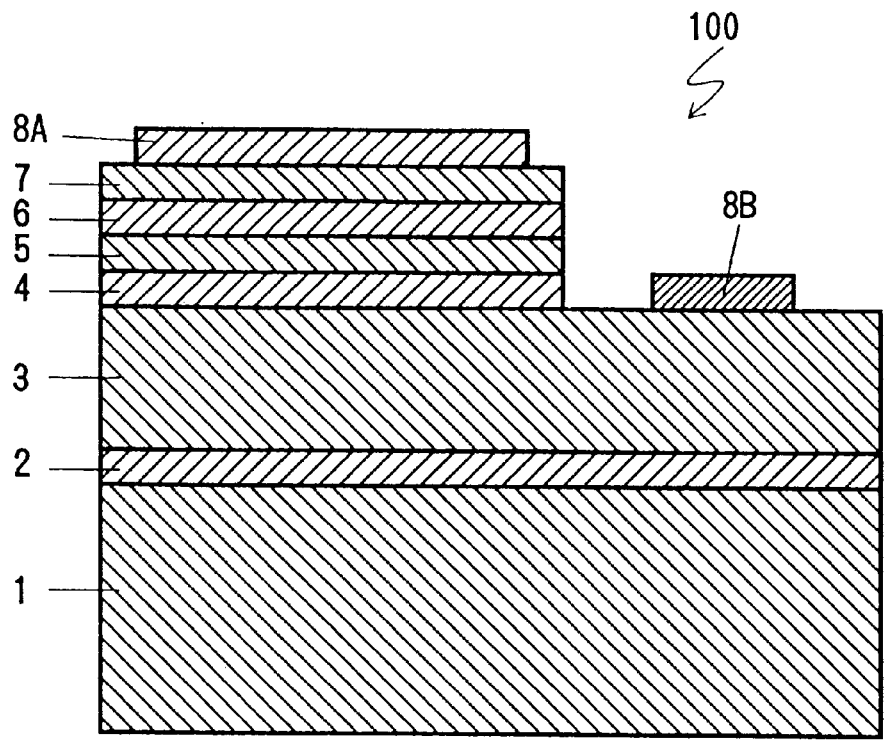
FIG. 1 is a sectional view of the structure of a light-emitting device in the example set forth below.

FIG. 1 shows a sectional view of a LED 100 made of Group III nitride compound semiconductor that has been formed on a sapphire substrate I. The Group III nitride compound semiconductor can satisfy the formula: $Al_xGa_yIn_{1-x-y}N$, wherein $0 \leq x \leq 1$, $0 \leq y \leq 0$, and $0 \leq x-y \leq 1$. An AlN buffer layer 2 is formed on the sapphire substrate 1 and an silicon (Si) doped gallium nitride (GaN) layer 3 of $n^+$-type is formed on the AlN buffer layer 2. An undoped n-layer 4, comprising of $Al_{0.1}Ga_{0.9}N$ and having a thickness generally of 0.5 $\mu$m, is formed on the n'-layer 3. A magnesium (Mg) doped GaN layer, or active layer 5, having a thickness generally of 0.4 $\mu$m, is formed on the n-layer 4. An Mg-doped $Al_{0.1}Ga_{0.9}N$ layer 6, having p-type conduction and having a thickness generally of 0.2 $\mu$m, is formed on the active layer 5. A highly Mg-doped $p^+$-layer 7, comprised of GaN and having a thickness generally of 0.15 $\mu$m, is formed on the p-layer 6. An electrode 8A is formed on the $p^-$-layer 7, by for example, vapor deposition, and an electrode 8B is formed on the $n^+$-layer 3. The electrode 8A has a double layer structure: for example, a nickel (Ni) layer that contacts the $p^-$-layer 7 and a gold (Au) layer formed on the Ni layer. The electrode 8B can be made of, for example, aluminum (Al).

A method of manufacturing the LED 100 is now explained.

Each layer, from the buffer layer 2 to the $p^+$-layer 7, were formed on the sapphire substrate 1 by metal organic vapor phase deposition (MOVPE). A titanium (Ti) layer of about 2000 Å in thickness was formed on the $p^+$-layer 7 and a nickel (Ni) layer of about 9000 Å in thickness was formed on the Ti layer. Then, a photoresist layer was laminated on the Ni layer and a portion of the photoresist layer where an electrode 8B is selected to be formed was removed by photolithography. Utilizing the remaining photoresist layer as a mask, the exposed portion of the Ti layer and the Ni layer were etched by use of an acid etching Liquid. Then, the remaining photoresist layer was removed from the Ti layer. Utilizing the remaining Ti and Ni layers as a mask, the exposed portion of the layers from the $p^+$-layer 7 down to the n-layer 4 were etched by reactive ion etching with gases containing chlorine. The remaining Ti and Ni layers were then removed by use of an acid etchant.

A photoresist layer 9 was uniformly laminated on the $p^+$-layer 7. A portion of the photoresist layer 9 where an electrode 8A is selected to be formed was removed in, for example, nearly square shape, so as to form a window 9A.

Figure 2A:
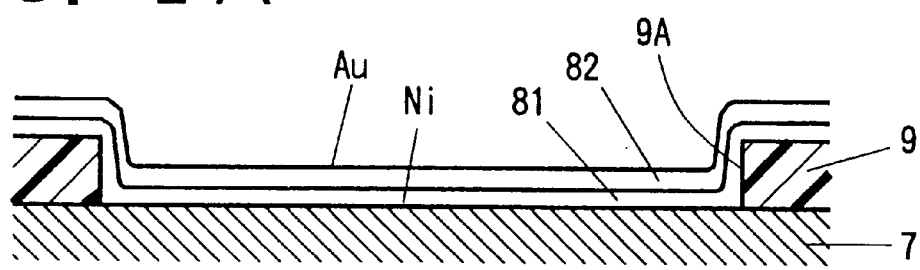
FIG. 2A is a sectional schematic illustration of a $p^+$-layer and an electrode before heat treatment.

FIG. 2A shows a sectional view of the $p^+$-layer 7 and metal electrode layers 81 and 82 deposited in the window 9A. A first metal electrode layer 81, comprised of Ni and having a thickness generally within the range of about 10 Å to 200 Å, was uniformly deposited in the window 9A of the exposed part of the $p^+$-layer 7 and on the photoresist layer 9 under high vacuum condition about $10^{-7}$ Torr in a deposition chamber. A second metal electrode layer 82, comprised of Au and having a thickness generally within the range of about 20 Å to 500 Å, was uniformly deposited on the first metal electrode layer 81.

After removal from the chamber, portions of the Ni and Au that had been deposited on the photoresist layer 9 were removed by a lift-off method. As a result, the electrode 8A, having a double layer structure comprising the Ni metal electrode layer 81 and the Au metal electrode layer 82, were obtained.

Optionally, an electrode pad can be formed. For example, after another photoresist layer is uniformly laminated on the entire sample, a portion of the photoresist layer is removed where the electrode pad is to be formed, thereby forming, for example, a window. Then, an alloy, containing Au or aluminum (Al) and having a thickness of about 1.2 $\mu$m, is uniformly deposited on the exposed portion of the Au layer 82 and the photoresist layer in the reaction chamber. The sample is then removed from the chamber, and the alloy containing Au or Al is removed by a lift-off method, which can be the same method used to form the electrode 8A.

The sample was then returned to the chamber for a process of heat treatment. After the chamber was evacuated to 1 m Torr, and then filled with nitrogen (N₂) to atmospheric pressure and closed, heat treatment was carried out for a period of time ranging generally from about several seconds (more than two) to 10 min under condition controlled by lowering the temperature to the range of about 400° C. to 700° C. Although N₂ was used as the gas for filling the chamber in the above embodiment, N₂, hydrogen (H₂), oxygen (O₂), neon (Ne), argon (Ar), and krypton (Kr) or any combination of these gases can be used. The ratio of partial pressure among N₂, H₂, O₂, Ne, Ar, and Kr ranges from about 0.01% to 100%, in addition, heat treatment may be carried out under the condition where the chamber is closed or by allowing the gases to flow through the chambers.

Figure 2B:
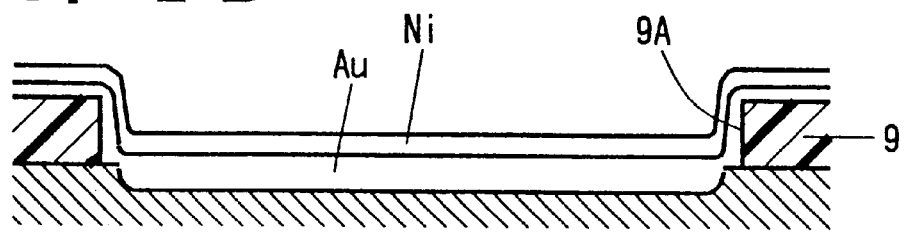

As a result of the heat treatment, the element of the second metal electrode layer 82 for example, Au, penetrated through the first metal electrode layer 81 and diffused into the p⁺layer 7, which comprised GaN, thereby forming an alloy of Au and GaN. For example, as shown in FIGS. 2A and 2B, the distribution of Au and Ni before heat treatment (FIG. 2A) was vertically reversed after heat treatment (FIG. 2B).

Figure 3:
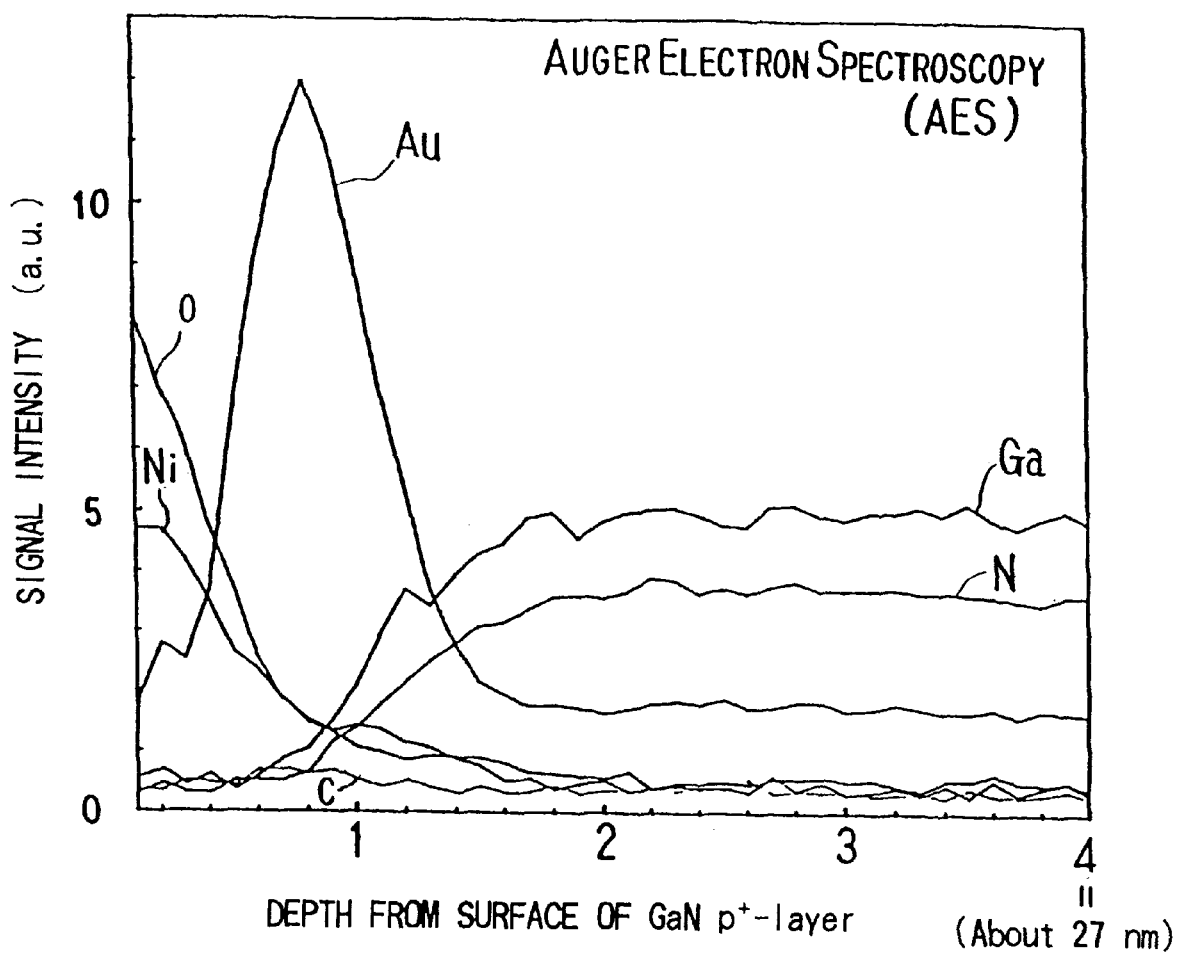
FIG. 3 is a graph showing distribution of elements of the LED analyzed by Auger electron spectroscopy (AES).

FIG. 3 is a graph showing the distribution of Au, Ni, Ca, and N in the LED 100 as analyzed by Auger electron spectroscopy (AES). Around from the surface of the p⁻-layer 7 and to about 3 nm down from the surface of the second metal electrode layer 82, the concentration of Ni was higher than that of Au. However, the concentration of Au became higher than that of Ni at a depth of more than about 3 nm from the surface of the second electrode layer 82. Thus, the element Au has penetrated through the first metal electrode layer 81 and deepen into the p⁺-layer 7 by about 9 nm in depth from the surface of the second electrode layer 82. As a result, an alloy of GaN and Au was formed.

The reversing of the distribution appears to be caused by the fact that the element of the first metal electrode layer has an ionization potential that is relatively lower than that of the element of the second metal electrode layer. By using the method discussed above, the element or the first metal electrode moves up towards the surface of the second metal electrode layer and thus, the element of the second metal electrode layer moves down and penetrates through the first metal electrode layer into the GaN layer thereby forming an alloy of GaN and Au. Since the element of the second metal electrode layer has a relatively better ohmic contact, than that of the element of the first metal electrode layer, the alloy formed of GaN and Au enhances the ohmic characteristics of the electrode. Further, the element of the first metal electrode layer, which is strongly connected to the Group III nitride compound semiconductor device, improves the adhesive strength of the electrode to a contacting layer or the device.

Alternatively, at least one of palladium (Pd), iridium (Ir), and platinum (Pt) can be used instead of, or in addition to, gold (Au) as the element of the second metal electrode layer. At least one of iron (Fe), copper (Cu), chromium (Cr), tantalum (Ta), vanadium (V), manganese (Mn), aluminum (Al), and silver (Ag) can be used as the element of the first metal electrode layer in stead of, or in addition to, nickel (Ni).

Further, a material that has an occlusion characteristic to hydrogen (H) may be selected as the first metal electrode layer. As a result, it occludes H from the surface layer of the semiconductor device that is formed beneath the first metal electrode layer and improves the crystallinity of the surface layer.

While the invention has been described in connection with specific exemplary embodiments, it is to be understood that the invention is not to be limited to the disclosed embodiments. Rather, the present invention is intended to include various modifications and equivalent arrangements, such as those that are within the spirit and scope of the appended claims.

What is claimed is:

1. An electrode for a Group III nitride compound semiconductor having p-type conduction comprising:

a double layer structure having a first metal electrode layer contacting said Group III nitride compound semiconductor and a second metal electrode layer being formed on said first metal electrode layer;

wherein said first metal electrode layer comprises an element having an ionization potential that is lower than that of an element of said second metal electrode layer;

said element of said second metal electrode layer having better ohmic contact to said Group III nitride compound semiconductor than said element of said first metal electrode layer;

said element of said second metal electrode layer being distributed more deeply into said Group III nitride compound semiconductor than said element of said first metal electrode layer by heat treatment.

2. The electrode of claim 1, wherein said element of said first metal electrode is at least one of nickel (Ni), iron (Fe), copper (Cu) chromium (Cr), tantalum (Ta), vanadium (V), manganese (Mn), aluminum (Al), and silver (Ag) and said element of said second metal layer is at least one of palladium (Pd), gold (AU), iridium (Ir), and platinum (Pt).

3. The electrode of claim 1, wherein said element of said first metal electrode is nickel (NI), and said element of said second metal electrode is gold (Au).

4. The electrode of claim 1, wherein said heat treatment is carried out in the range from about 400° C. to 700° C.

5. The electrode of claim 2, wherein said heat treatment is carried out in the range from about 400° C. to 700° C.

6. The electrode of claim 3, wherein said heat treatment is carried out in the range from about 400° C. to 700° C.

7. The electrode of claim 1, wherein said first metal electrode layer has a thickness of about 10 Å to 200 Å.

8. The electrode of claim 1, wherein said second metal electrode layer has a thickness of about 20 Å to 500 Å.

9. A Group III nitride compound semiconductor device having an electrode of claim 1 and further comprising:

semiconductor layers having Group III nitride compound semiconductor formed beneath said electrode.

10. A semiconductor device of claim 9, wherein said semiconductor layers having Group III nitride compound semiconductor satisfy the formula, $Al_xGa_yIn_{1-x-y}N$, wherein $0 \leq x \leq 1$, $0 \leq y \leq 1$ and $0 \leq x+y \leq 1$.

11. A semiconductor device of claim 9, wherein said Group III nitride compound semiconductor device is one of a light-emitting diode (LED), a light-emitting laser diode (LD) and a transistor.

12. The electrode of claim 1, where in said heat treatment is performed in an atmosphere that includes oxygen.

13. The electrode of claim 3, wherein said nickel (Ni) is combined with oxygen (O).

14. The electrode of claim 13, wherein said nickel (Ni) combined with said oxygen (O) distributes with a density higher at the surface of said electrode than at a bottom of said electrode.

* * * * *